United States Patent [19]
Klein

[11] Patent Number: 5,037,105
[45] Date of Patent: Aug. 6, 1991

[54] DECORATIVE OR DISPLAY DEVICE

[76] Inventor: Benjamino P. L. J. Klein, Jupiter 81, 1188 Amstelveen, Netherlands

[21] Appl. No.: 511,714

[22] Filed: Apr. 20, 1990

[30] Foreign Application Priority Data

May 2, 1989 [GB] United Kingdom ............... 8909978

[51] Int. Cl.⁵ .............................................. A63F 3/00
[52] U.S. Cl. ................................... 273/237; 273/241; 273/271; 273/DIG. 1; 273/DIG. 14; 273/DIG. 16; 273/DIG. 24
[58] Field of Search .......... 273/271, 241, 237, 153 R, 273/DIG. 1, DIG. 14, DIG. 16, DIG. 24

[56] References Cited

U.S. PATENT DOCUMENTS

| | | | |
|---|---|---|---|
| 2,676,018 | 4/1954 | Cornish et al. | 273/241 |
| 3,747,931 | 7/1973 | Tuan | 273/283 |
| 3,888,487 | 6/1975 | Reploge | 273/241 |
| 4,809,979 | 3/1989 | Skowronski et al. | 273/153 R |

Primary Examiner—Benjamin Layno
Attorney, Agent, or Firm—Charles E. Baxley

[57] ABSTRACT

Decorative or display device for game-playing, amusement or aesthetic purposes comprises a three-dimensional array of switchable indicators in a transparent matrix. The indicators may be light sources e.g. led's and may be used to play games such as noughts and crosses in 3-dimensions. A non-electric version has a stack of separable layers with beads insertable in recesses.

5 Claims, 3 Drawing Sheets

DECORATIVE OR DISPLAY DEVICE

BACKGROUND TO THE INVENTION

This invention relates to decorative or display devices for game-playing, amusement or aesthetic purposes.

The simple game of noughts and crosses can be played with pencil and paper, but, notionally, in three dimensions by having three 3×3 grids. Whilst this may be intellectually stimulating, and whilst the "equipment" cost is practically zero, there is nothing very attractive about the game, as, for example, there is, on the contrary, about chess played on a proper board with nicely-made pieces.

The present invention provides, inter alia, a device by which such a game can be played more interestingly, but which will also, gratuitously, have other uses and applications.

SUMMARY OF THE INVENTION

The invention comprises a decorative or display device for game-playing, amusement and aesthetic purposes, comprising a three-dimensional array of switchable indicators in a transparent matrix.

The indicators may be of such a size in relation to their spacing, as will permit a substantially unobstructed view of each from most viewpoints.

The matrix may be solid matrix of a transparent material, which may be a transparent plastics material.

The indicators may be electrically switchable, and the matrix may then support electrical conductors thereto. Said electrical conductors may be of transparent film circuits or otherwise unobtrusive so as not to impede observation of the indicators.

The indicators may comprise terminations of optical fibres.

The matrix may comprise a framework supporting the array, however.

In one arrangement, the device may comprise a stack of layers of matrix material. The layers may be separable and the switchable indicators comprise recesses with inserts.

The indicators may have two states, so that for example they may comprise an on/off device such as a light-emitting diode or a liquid crystal device or, in the case of a recess with an insert, the presence or absence of an insert such as a peg or ball. Or the indicators may have three or more states. Thus, in the case of recesses with inserts, more than one colour of insert may be provided. Or a light-emitting diode can be of the reversible-polarity type which can cisplay red or green, for example, or of the type which displays say red or yellow or green depending upon the voltage across it. When optical fibres are used, they may conduct no light, for one state, or monochromatic or which light for another state.

The device may comprise a supporting pedestal (the term is used loosely to describe anything upon which the device stands or by which it is attached to a wall or ceiling) which may house power and control means for the electrically-operated indicators. Said control means may comprise program means adapted for game-playing, and said program means may be adaptable, as by selectable program modules to playing different games.

Switch means for electric indicators may be actuable by "touching" coordinate sets of the array.

BRIEF DESCRIPTION OF THE DRAWINGS

Embodiments of decorative or display devices according to the invention will now be described with reference to the accompanying drawings, in which.

DETAILED DISCLOSURE OF THE PREFERRED EMBODIMENT

The drawings illustrate decorative or display devices for game-playing, amusement and aesthetic purposes comprising a three-dimensional array of switchable indicators in 11 a transparent matrix 12. The indicators 11 are of such a size, in relation to their spacing, as will permit a substantially unobstructed view of each from most viewpoints. Obviously, if one is looking at one face of the array, one or more rows or columns of indictors of the array will be more or less obscured; but by shifting viewpoint slightly, the indicators of the obscured row will, provided the size and spacing are right, soon all become visible before one or more of them becomes obstructed by one or more indicators of another row or column.

Figure 1:
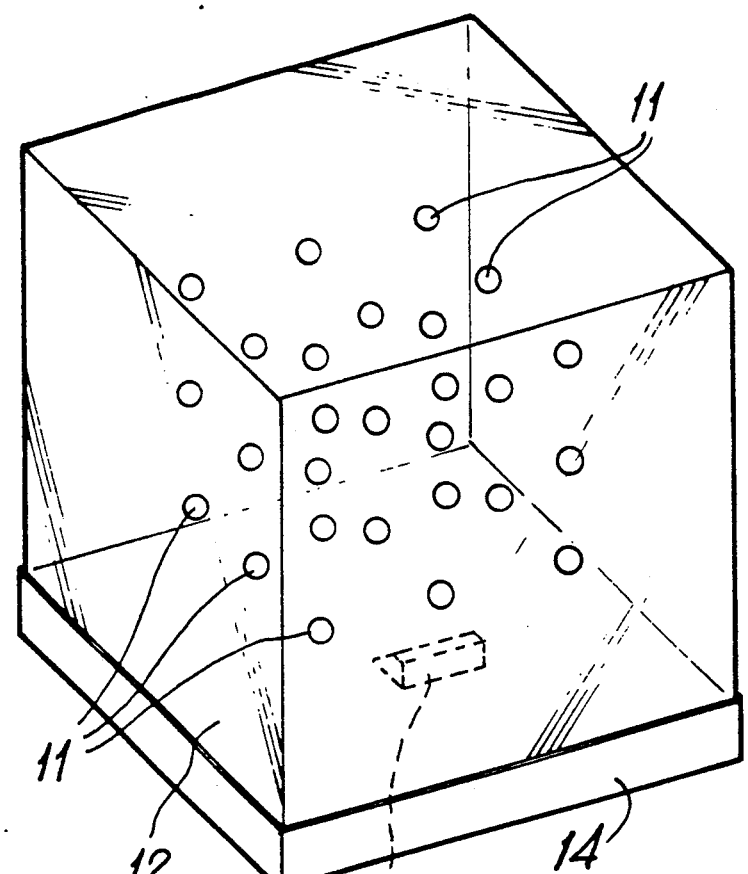
FIG. 1 is a perspective view of a first embodiment.
Figure 2:
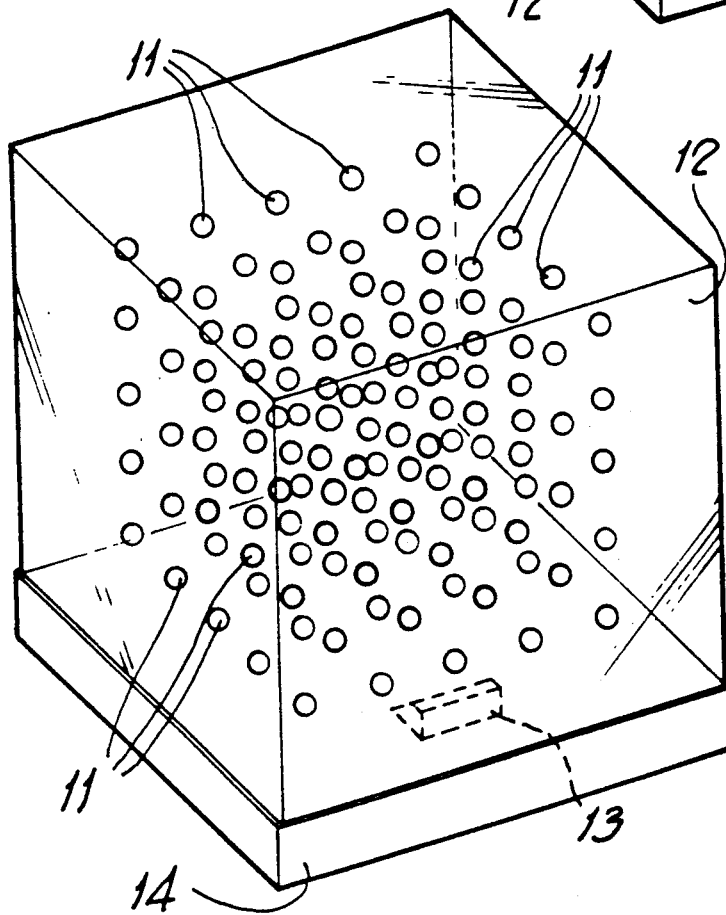
FIG. 2 is a perspective view of a second embodiment.

FIG. 1 illustrates a 3×3×3 array, while FIG. 2 illustrates a 5×5×5 array.

The devices can be used in a multiplicity of ways.

Basically, assuming for the moment that each indicator is a two state indicator, for example a lamp such as light-emitting diode (led) which can be on or off, and that there are suitable switching arrangements, a rudimentary form of three-dimensional "noughts and crosses" can be played. The object of this game is to be the first player to complete a line of three illuminated lamps. This is perhaps a trivial example on a 3×3×3 array, but is more complicated on a 4×4×4 and higher arrays.

A better game of noughts and crosses can be played if the indicators are three state devices, if, for example, they can be either off, or glow green or glow red. One player may then play green, the other red, the object being to be the first to complete a line of his colour.

Sufficient complication to make for interesting game possibilities can be had with cubic arrays of modest dimensions such as 3×3×3 or 5×5×5, but with an 8×8×8 or 10×10×10 array, English or Continental draughts may be played, respectively, in three dimensions. There is no need for the arrays to be cubic—they could be cuboidal, for example, and might not even be confined to rectangular coordinate arrays; arrays based on a tetrahedrom or prism or cylinder or "onion skin" arrays on concentric spherical surfaces or ellipsoidal surfaces or any other geometric arrangement can be envisaged.

FIGS. 1 and 2 show the indicators embedded in a solid matrix of transparent material such as a plastics material, for example, an acrylic or polycarbonate material. Such an arrangement might be made by assembling the indicators such as led's, together with their wiring, in a framework and encapsulating the framework in the liquid material and setting the same solid. Or the arrangement might be built up from layers of solid material, inserting the indicators together with transparent film circuitry therefore between the layers, and bonding the layers together. The usual arrangements will be made in either case to terminate the wiring at a connector 13 which can be encapsulated or embedded in the base to mate with another in the pedestal 14.

Figure 3:
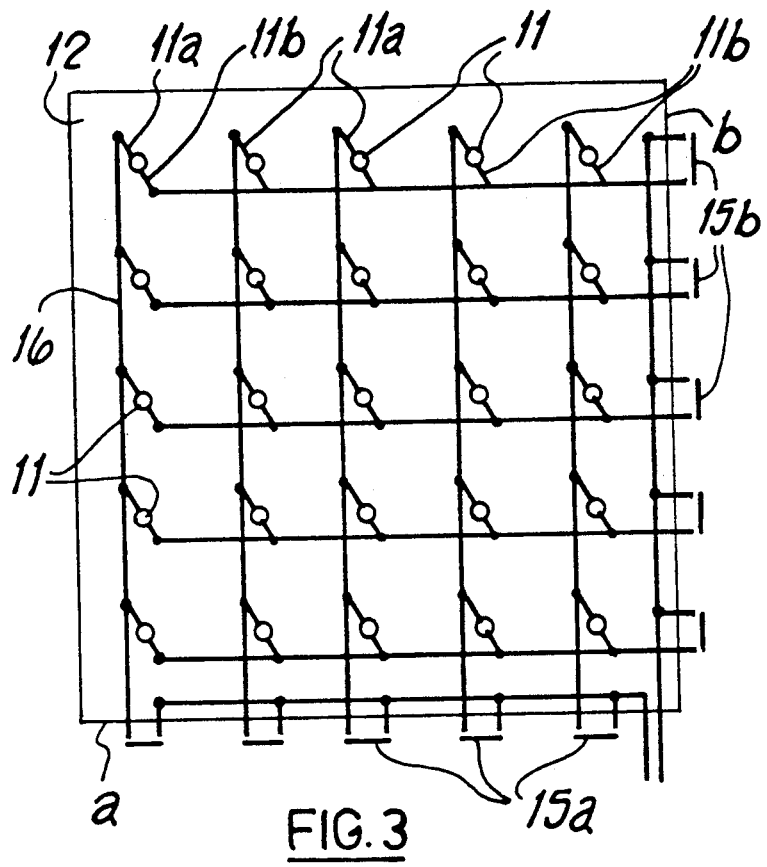
FIG. 3 is a plan view of a layer of the embodiment of FIG. 2, with electric indicators and showing a connection scheme therefor.

A typical wiring arrangement for a single layer of a 5×5×5 arrangement is shown in FIG. 3. For simplicity, two-state, i.e. off/on indicators 11 are shown, which are operated by "touch" switches 15a,15b along adjacent side faces a, b, of the layer. Each indicator 11 has two leads 11a, 11b. Each switch 15a connects by a connector 16 all the leads 11a in its row to one pole of an operating voltage source, each switch 15b connects all the leads 11b in its row. Touching simultaneously any one of the five switches 15a and any one of the five switches 15b will operate the indicator uniquely in the row of that switch 15a and the transverse row of that switch 15b. The operating voltage thus applied switches on the indicator; it is necessary to latch this indicator on, thereby freeing the touch switches 15a, 15b for switching on other indicators in this layer. This can clearly be done electronically in any one of a number of different ways. Thus, for example, the connectors 16 may carry permanently a sustaining potential, each indicator having circuitry such that a change in that potential fires the indicator on and it is sustained on after the potential reverts to the sustaining potential. Or the touch switches might be wired not directly to the indicators but via additional connectors to a control unit in the pedestal which effects the latching.

For the more complicated, three (and more) state indicators, the circuitry would be more complex, but still readily capable of being realised in film technology and operated by a microprocessor arrangement in ways that will be readily apparent.

For a two-player game, involving each indicator being off, glowing red or glowing green, one player would play red and the other green, taking turns. The control arrangement could be programmed to respond to the first indicator selection by switching it on red, the next green and so on alternatively. It could also be programmed to respond to a win—which might for example be defined as the completion of a straight line of five indicators all in one colour, by flashing that line.

Of course, different games may be played, for example, one in which the aim is to be first to form a cube instead of a line.

A microprocessor control arrangement may be programmed to act as a player, programmed with instructions or algorithms enabling it to select the best next move, as is common, for example, nowadays with electronic chess-playing machines.

Instead of touch switches, of course, a joystick or a keyboard input or a computer "mouse" or any other conventional type of input may be used —even a voice-activated input.

More complicated games still, possibly involving more than two players, may be possible using multi-state indicators, for example led's the colour of which depends on the voltage—such can be obtained displaying three or four different colours.

A fibre-optic arrangement could have a compact led array inside the pedestal connected to a multi-fibre coupler to which a like coupler on the matrix is connected.

Figure 5:
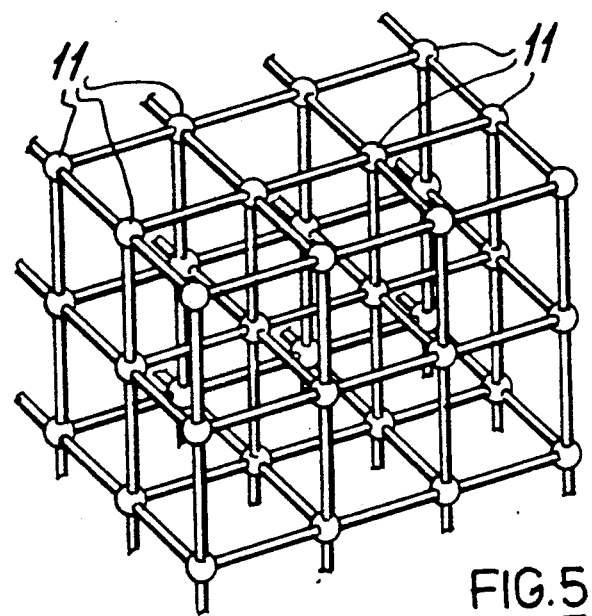
FIG. 5 is a perspective view of another embodiment.

Instead of being embedded in a solid matrix, of course, the indicators could be arranged on a framework of tubular supports containing the conductors (or optical fibres). Such an arrangement is illustrated in FIG. 5.

Any or all of these electrically-operated arrangements may of course be programmed using a microprocessor to act as a dynamic display, for example for aesthetic purposes, the indicators being switched in programmed or random or quasi-random sequences to produce changing light patterns. The device may be made quite small—centimeter dimensions for example—for a table game-playing arrangement, or as large as may be desired, for example, metre dimensions, for an out-door dynamic sculpture.

Figure 4:
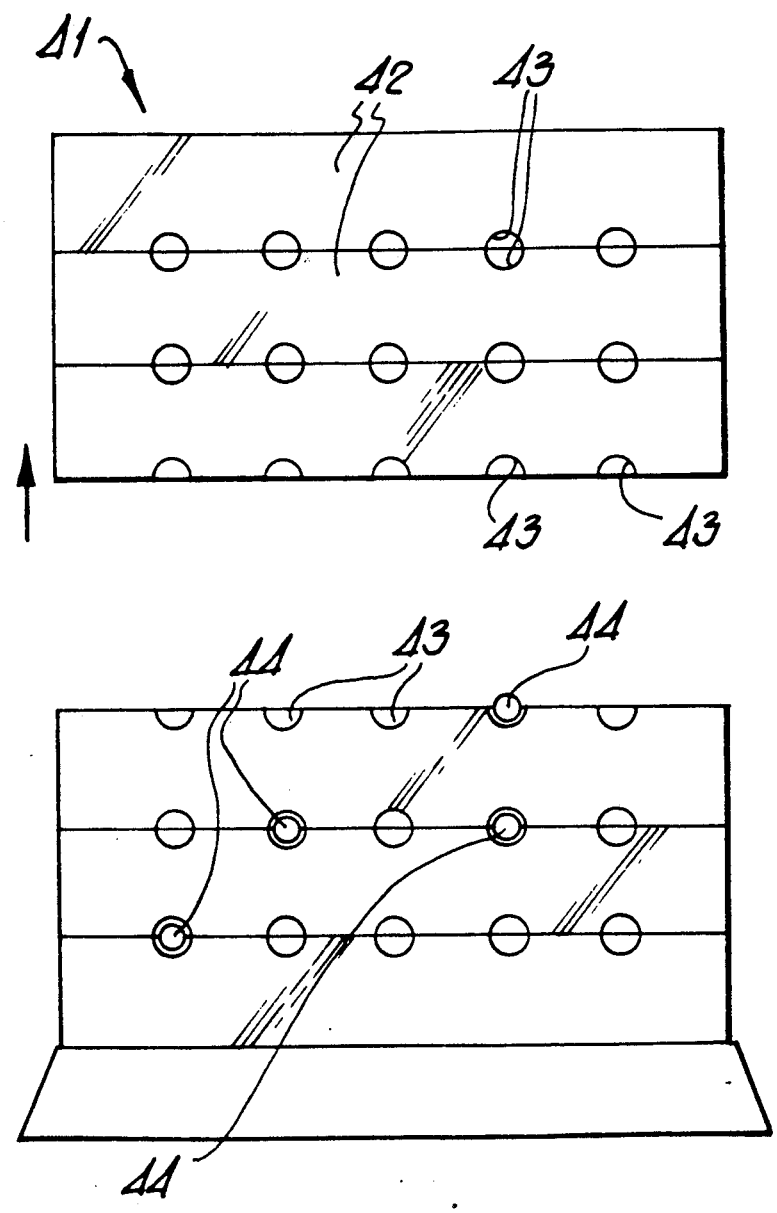
FIG. 4 is a vertical section through an embodiment like FIG. 2 but with separable matrix layers, showing the matrix separated at one level.

To return, however, to the game-playing arrangement, and noting that any form of illuminated indicator requires a fairly complicated and somewhat costly (unless mass-produced) electronics package, a "manual" version is illustrated in FIG. 4 which has the advantages of simplicity and ease of manufacture, and of being inexpensive. This arrangement comprises a stack 41 of six layers of transparent blocks 42 each having on upper and lower faces a 5×5 array of hemispherical recesses 43—except that the upper face of the uppermost layer and the lower face of the lowermost layer do not need these recesses. Sets of beads 44 of different colours are provided which can be placed in the uppermost recesses of any one of the layers by lifting up the layer or layers above it, as illustrated. The top three layers have been raised enough to insert a bead 44. The thus raised layers are then replaced.

This "game" may be made more complicated by the fact that rules may permit the lifted layers being rotated through 90° or 180° before being replaced.

It will be appreciated that many different games can be played with any one embodiment, and many different embodiments can be envisaged involving shape and size of the array, number of states of the indicators, constraints on operating the indicators (such for example as restricting the number of "reds" or "greens" in a row, or not allowing an indicator to be operated immediately adjacent an opponent's indicator) and so on without departing from the scope of the invention.

I claim:

1. Decorative or display device for game-playing, amusement and aesthetic purposes, comprising a three-dimensional array of switchable indicators in a transparent matrix, in which the matrix is a solid matrix of transparent material, the indicators are electrically switchable and the matrix supports electrical conductors thereto, and in which the said electrical conductors are of transparent film circuits or otherwise unobtrusive so as not to impede observation of the indicators.

2. Device according to claim 1, in which the matrix is of a transparent plastics material.

3. Device according to claim 1, in which the indicators are terminations of optical fibres.

4. Device according to claim 1, comprising a stack of layers of matrix material.

5. Decorative or display device for game-playing, amusement and aesthetic purposes, comprising a three-dimensional array of switchable indicators in a transparent matrix, having switch means for the indicators, in which the switch means are actuable by "touching" co-ordinate sets of the array, said switch means including indicators and "touch" switches for operating said indicators.

* * * * *